(12) United States Patent
Yamada et al.

(10) Patent No.: US 6,201,683 B1
(45) Date of Patent: Mar. 13, 2001

(54) CERAMIC ELECTRONIC PART AND MOUNTING STRUCTURE FOR THE SAME

(75) Inventors: Masayuki Yamada; Takuji Nakagawa, both of Takefu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/301,251

(22) Filed: Apr. 28, 1999

(30) Foreign Application Priority Data

May 29, 1998 (JP) .................................................. 10-148540

(51) Int. Cl.[7] ............................ H01G 2/20; H01G 4/228
(52) U.S. Cl. .................... 361/308.1; 361/309; 361/321.2
(58) Field of Search .............................. 361/306.1, 308.1, 361/309, 310, 321.1–321.2, 306.3, 329, 321.5, 807, 811, 763, 766–767; 174/260; 338/276, 315

(56) References Cited

U.S. PATENT DOCUMENTS 1,611,183 * 12/1926 Frasse ............................... 361/308.1
4,158,218 * 6/1979 McLaurin et al. ................. 361/308.1

FOREIGN PATENT DOCUMENTS 2327631   2/1999 (GB) .

* cited by examiner

Primary Examiner—Anthony Dinkins
(74) Attorney, Agent, or Firm—Ostrolenk, Faber, Gerb & Soffen, LLP

(57) ABSTRACT

In a mounting structure for a ceramic electronic part in which a terminal member formed of a metal plate is connected to a terminal formed on a ceramic electronic component, thermal effects caused by a substrate are to be suppressed to prevent mechanical damage to the ceramic electronic component, such as cracking. For this purpose, a length of an intermediate portion between the ceramic electronic component and the substrate, measured along the length of the terminal member, is at least 5 mm.

20 Claims, 2 Drawing Sheets

CERAMIC ELECTRONIC PART AND MOUNTING STRUCTURE FOR THE SAME

BACKGROUND OF THE INVENTION

1. Field of the Invention

The present invention relates to a ceramic electronic part and to a mounting structure therefor, and more specifically relates to an improvement in a terminal portion of a ceramic electronic part having a ceramic electronic component such as a monolithic ceramic capacitor.

2. Description of the Related Art

When a ceramic electronic part, having a ceramic electronic component, such as a monolithic ceramic capacitor, in which terminals are formed on both sides thereof, is mounted on a substrate, the ceramic electronic part is liable to cause mechanical damage to the ceramic electronic component, such as cracks due to thermal effects caused by the substrate. Such damage is especially prone to occur when a heat-producing component is located adjacent thereto, or if the substrate is made of aluminum having a high heat-dissipation rate.

In these cases, temperature differences in the ceramic electronic component of the ceramic electronic part are produced one or more times, resulting in mechanical failure of the ceramic electronic component. In particular, when the ceramic electronic component is mounted on an aluminum substrate, relatively large stresses are exerted on the ceramic electronic component by the substrate due to the large thermal expansion difference between the aluminum substrate and the ceramic electronic component, during temperature increase or decrease, similarly resulting in mechanical failure of the ceramic electronic component.

To solve the above-mentioned problem, a metal terminal member is connected to the terminal formed on the ceramic electronic component, and the ceramic electronic component is mounted on the substrate via the terminal member. This terminal member reduces the thermal conduction to the ceramic electronic component from the substrate and also alleviates the stresses exerted on the ceramic electronic component, absorbing the thermal expansion difference between the substrate and the ceramic electronic component by its own deformation.

However, the terminal member has not proved sufficiently effective in preventing mechanical failure of the ceramic electronic component under certain conditions. When thermal conditions are extreme for the ceramic electronic component in particular, mechanical failure often occurs.

SUMMARY OF THE INVENTION

Accordingly, it is an object of the present invention to provide a ceramic electronic part and a mounting structure therefor which is capable of solving the above-mentioned problems.

In accordance with one aspect of the present invention, a ceramic electronic part comprises a ceramic electronic component having a terminal formed at an end thereof and a terminal member formed of a metal plate which comprises a connecting portion for connecting to the terminal, an intermediate portion, and a fitting portion for connecting to a substrate sequentially along a length of the terminal member from one end to the other thereof, the terminal member being connected to the terminal via the connecting portion, wherein length of the intermediate portion measured along the length of the terminal member is at least 5 mm.

In a ceramic electronic part according to the present invention, the length of the intermediate portion may be equal to or less than 10 mm.

In a ceramic electronic part according to the present invention, the thermal conductivity of the terminal member may be equal to or less than 0.3 cal/cm/sec/° C.

In a ceramic electronic part according to the present invention, the degree of radiation of the terminal member may be at least 0.03, provided that the blackbody radiation-degree is 1.

In accordance with another aspect of the present invention, a ceramic electronic-part mounting structure comprises a substrate and a ceramic electronic component mounted on the substrate, the ceramic electronic component having a terminal formed thereon and further comprising a terminal member formed of a metal plate in which one end thereof is connected to the terminal, wherein a length of the terminal member between the ceramic electronic component and the substrate measured along the length of the terminal member is at least 5 mm.

DETAILED DESCRIPTION OF EMBODIMENTS OF THE INVENTION

Figure 1:
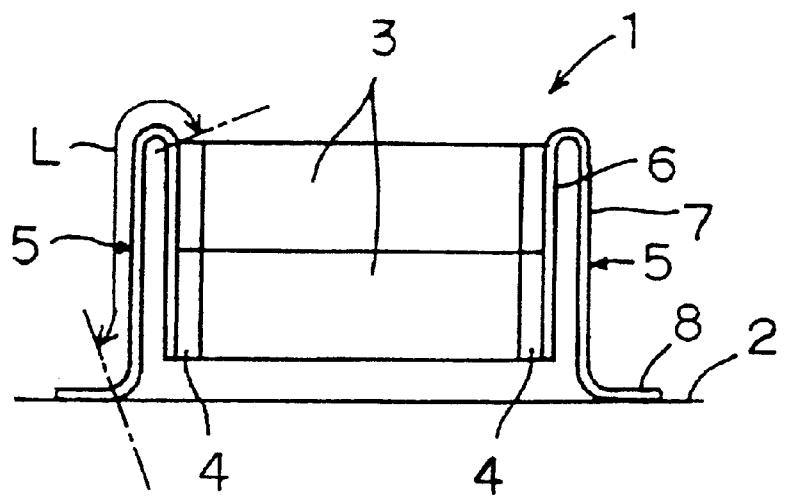
FIG. 1 is a front view illustrating a mounting state of a ceramic electronic part 1 according to a first embodiment of the present invention.

FIG. 1 is a front view illustrating a state in which a ceramic electronic part 1 according to a first embodiment of the present invention is mounted on a substrate 2.

The ceramic electronic part 1 comprises two ceramic electronic components 3 forming monolithic ceramic capacitors, for example. Terminals 4 are formed on both ends of each ceramic electronic component 3. The terminal 4 may be formed by a thin-film forming technique such as sputtering, evaporation or plating, or by a thick-film forming technique of applying and sintering a conductive paste. The terminal may also be formed by plating on the thick film formed by the thick film forming-technique. These ceramic electronic components 3 are vertically stacked and are bonded together by an adhesive (not shown).

A terminal member 5 is commonly connected to each of the terminals 4 of the two ceramic electronic components 3. More specifically, the terminal member 5 is formed of a metal plate folded in a shape of an inverse-U overall. The metal plate forming the terminal member 5 comprises a connecting portion 6 connecting to the terminal 4, an intermediate portion 7 and a fitting portion 8 connecting to the substrate 2, sequentially along the length of the metal plate from one end to the other. The terminal member 5 is connected to the ceramic electronic components 3 by connecting the connecting portion 6 to each terminal 4 by using solder, a conductive adhesive (not shown), welding or the like.

The ceramic electronic part 1 comprising the terminal member 5 formed of a metal plate is mounted on the substrate 2 by applying solder to the fitting portion 8 of the terminal member 5 positioned on the substrate 2 to achieve soldering between the fitting portion 8 and the substrate 2.

In the ceramic electronic part 1, a length "L" of the intermediate portion 7 measured along the length of each terminal member 5 is to be 5 mm or more. The length "L" of the intermediate portion 7 corresponds to the length of the terminal member 5 in the mounted state between the ceramic electronic component 3 and the substrate 2. More specifically, it corresponds to the length of the region not being anchored by solder or the like. Therefore, the length between the ceramic electronic components 3 and the substrate 2 can be also represented as "L".

By increasing "L" to 5 mm or more in this manner, conduction of heat applied to the ceramic electronic component 3 by the substrate 2 can be delayed, resulting in prevention of mechanical failure such as cracks being liable to occur in the ceramic electronic component 3. To confirm this effect, the following experiment was performed.

As a ceramic electronic component 3, a monolithic ceramic capacitor was formed of a dielectric ceramic having a lead-composite perovskite structure which is known to have a large capacitance, although it has a comparatively low bending strength. A material formed of a copper alloy was used as the terminal member 5.

Prepared and mounted on the substrate 2 were ceramic electronic parts 1 having the length "L" of the intermediate portion 7 of the terminal member 5 of 1 mm, 3 mm, 4 mm, 5 mm, and 10 mm, respectively. In each case, soldered regions of the terminal member 5 were not included in the length "L" of the intermediate portion 7. The intermediate portions 7 of the terminal members 5 having short lengths "L" were mounted without being folded in a shape of an inverse "U".

In this mounted state, 1000 cycles of temperature cycling, from −50° C. to 125° C., of the substrate 2 were performed to check for cracks produced in the ceramic electronic component 3 of each ceramic electronic part 1.

The relationship between the length "L" of the intermediate portion 7 of the terminal member 5 and the incidence of cracks is shown in the following Table 1. In addition, Table 1 includes values of equivalent series resistance at a frequency of 100 kHz for each of the samples made available for the specific experiment.

TABLE 1

| Length "L" [mm] | Crack incidence | Equivalent series resistance [mΩ] |
|---|---|---|
| 1 | 30/30 | 4.1 |
| 3 | 13/30 | 4.5 |
| 4 | 2/30 | 4.7 |
| 5 | 0/30 | 4.9 |
| 10 | 0/30 | 6.3 |

As shown in TABLE 1, the longer the length "L" of the intermediate portion 7 of the terminal member 5, the more the incidence of cracks is correspondingly reduced, resulting in prevention of cracks when "L" is 5 mm or more.

In addition, when values of equivalent series resistance shown in TABLE 1 are noted, the longer the length "L" of the intermediate portion 7 of the terminal member 5, the more the value of equivalent series resistance is correspondingly increased. When the length "L" increases to above 10 mm, the value of equivalent series resistance, of course, increases to over 6.3 mg, although this is not shown in TABLE 1. When the value of equivalent series resistance increases in this manner, electrical characteristics of the ceramic electronic part may be degraded. From this viewpoint, it is preferable that the length "L" of the intermediate portion 7 of the terminal member 5 be below 10 mm.

As stated above, the reason for preventing the ceramic electronic component 3 from cracking by increasing the length "L" of the intermediate portion 7 of the terminal member 5 to 5 mm or more is that the thermal conduction from the substrate 2 to the ceramic electronic component 3 can be delayed to reduce the thermal conduction to the ceramic electronic component 3.

Similarly, it is also effective for reducing the thermal conduction to the ceramic electronic component 3 that thermal conductivity of the terminal member 5 be reduced or thermal dissipation be increased.

The former thermal conductivity of the terminal member 5 is preferably below 0.3 cal/cm/sec/° C. and materials which may be advantageously used for the terminal member 5 are a ferronickel alloy (thermal conductivity: 0.065 cal/cm/sec/° C.) and brass (thermal conductivity: 0.290 cal/cm/sec/° C.).

As for the latter thermal dissipation, it is preferable that the degree of radiation of the terminal member 5 be 0.03 or more, provided that the blackbody radiation-degree is 1. With regard to this point, materials which may be advantageously used for the terminal member 5 are copper, silver, brass (radiation-degree: 0.03), iron (radiation-degree: 0.6), and aluminum (radiation-degree: 0.04).

Among the above-mentioned preferable materials, with regard to thermal conductivity and thermal dissipation, there may be some materials having series resistance which is increased to a non-negligible order when being used as a material for the terminal member 5. In this case, it is effective for reducing the series resistance that the terminal member 5 be plated with a highly conductive metal such as nickel, copper, silver, or solder. This plating may be performed by using a kind of metal or may be formed into multiple layers with two or more metals.

Figure 2:
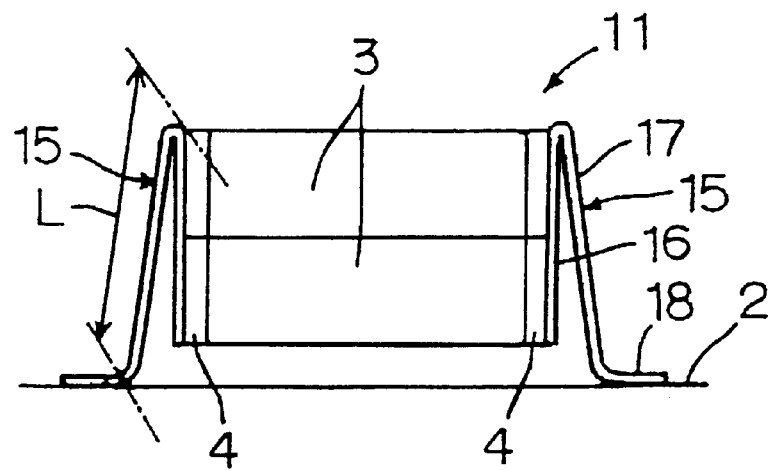
FIG. 2 is a front view illustrating a mounting state of a ceramic electronic part 11 according to a second embodiment of the present invention.
Figure 3:
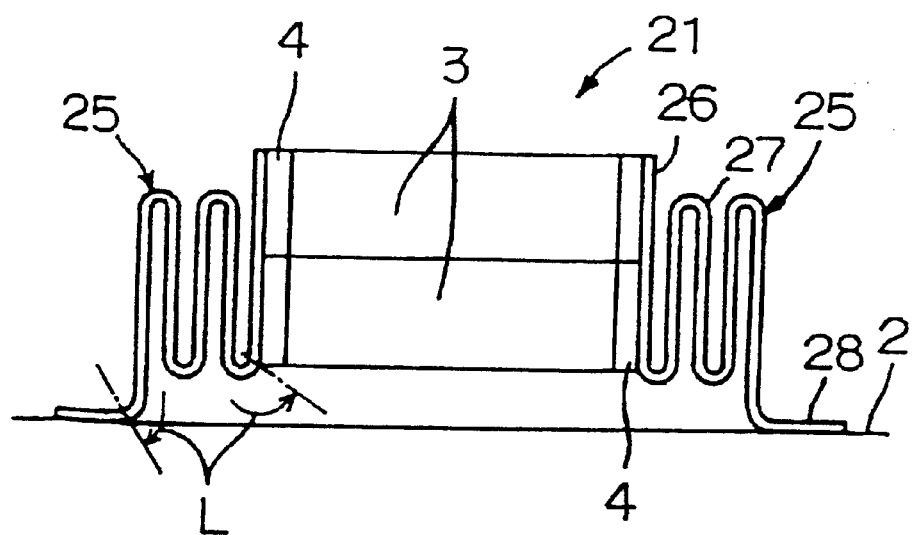
FIG. 3 is a front view illustrating a mounting state of a ceramic electronic part 21 according to a third embodiment of the present invention.

FIGS. 2 and 3 are equivalent drawings to FIG. 1 showing ceramic electronic parts 11 and 21 in accordance with a second and a third embodiment of the present invention, respectively. In FIGS. 2 and 3, like elements are given like reference numerals of FIG. 1, and redundant descriptions are omitted.

The ceramic electronic part 11 shown in FIG. 2 has a terminal member 15 formed of a metal plate comprising a connecting portion 16, an intermediate portion 17, and a fitting portion 18, in a manner identical with that of the terminal member 5 shown in FIG. 1. The terminal member 15, however, is folded in the shape of an inverse-V overall. The intermediate portion 17 of the terminal member 15 extends in a generally straight line and the length "L" of the intermediate member 17 is 5 mm or more.

The ceramic electronic part 21 shown in FIG. 3 also has a terminal member 25 formed of a metal plate comprising a connecting portion 26, an intermediate portion 27, and a fitting portion 28, in a manner identical with that of the terminal member 5 shown in FIG. 1. The intermediate portion 27 of the terminal member 25 has a shape extending in a zigzagging manner and the length "L" of the intermediate member 27 is 5 mm or more. The zigzag shape of the intermediate member 27 shown in FIG. 3 may be advantageously adopted for a ceramic electronic component 3 which is so miniaturized that the length "L" of 5 mm or more cannot be secured in the intermediate members 7 and 17 of the terminal members 5 and 15 shown in FIGS. 1 and 2, respectively.

Descriptions of the embodiments of the present invention shown in the drawings have been given as above. However, other various modifications may be made without departing from the scope of the present invention.

For example, while each of the ceramic electronic parts 1, 11, and 21 has two ceramic electronic components 3 in the embodiments shown in the drawings, the number of ceramic electronic components 3 can be chosen arbitrarily, that is, it may be three or more, or may be one.

The ceramic electronic component 3 is also not limited to a monolithic ceramic capacitor, and it may comprise other ceramic electronic part(s) having different function(s).

The shapes of the terminal members 5, 15, and 25 have been only typically shown in the drawings of each of the embodiments, and various other shapes can be adopted.

As described above, according to the present invention, a length of the intermediate portion sandwiched between the connecting portion to the terminal and the fitting portion to the substrate is at least 5 mm measured along the length of the terminal member, that is, the length between the ceramic electronic component in a mounted state and the substrate is to be at least 5 mm. Therefore, thermal conduction from the substrate to the ceramic electronic component can be delayed to reduce the thermal effects on the ceramic electronic component. This results in preventing mechanical failure of the ceramic electronic component, such as cracking due to thermal effects.

In a ceramic electronic part according to the present invention, since a length of the intermediate portion is below 10 mm, the value of equivalent series resistance increase can be suppressed, preventing electrical characteristics of the ceramic electronic part from undesired degradation.

In a ceramic electronic part according to the present invention, when a thermal conductivity of the terminal member is below 0.3 cal/cm/sec/° C., the thermal conduction by the terminal member itself can also be effectively suppressed in addition to the thermal conductivity suppression by the above-mentioned length of the intermediate portion.

In a ceramic electronic part according to the present invention, when the degree of radiation of the terminal member is 0.03 or more, the heat-transmission depression at the terminal can be more effective due to the large thermal dissipation from the terminal member.

What is claimed is:

1. A ceramic electronic part comprising:
    a ceramic electronic component having a terminal formed at an end thereof; and
    a terminal member comprising a metal plate having a first end and a second end, the metal plate comprising a connecting portion at the first end for connecting to the terminal, an intermediate portion, and a fitting portion for connecting to a substrate sequentially along a length of said terminal member from the first end to the second end thereof, said terminal member being connected to the terminal by the connecting portion, wherein the length of the intermediate portion measured along the length of said terminal member is at least 5 mm.

2. The ceramic electronic part of claim 1, wherein the length of the intermediate portion is equal to or less than 10 mm.

3. The ceramic electronic part of claim 1, wherein a thermal conductivity of said terminal member is equal to or less than 0.3 cal/cm/sec/° C.

4. The ceramic electronic part of claim 1, wherein a degree of radiation of said terminal member is at least 0.03, provided that the blackbody radiation-degree is 1.

5. The ceramic electronic part of claim 2, wherein a thermal conductivity of said terminal member is equal to or less than 0.3 cal/cm/sec/° C.

6. The ceramic electronic part of claim 2, wherein a degree of radiation of said terminal member is at least 0.03, provided that the blackbody radiation-degree is 1.

7. The ceramic electronic part of claim 3, wherein a degree of radiation of said terminal member is at least 0.03, provided that the blackbody radiation-degree is 1.

8. The ceramic electronic part of claim 1, wherein the metal plate has an inverted U-shape.

9. The ceramic electronic part of claim 1, wherein the metal plate has an inverted V-shape.

10. The ceramic electronic part of claim 1, wherein the metal plate has a zig-zag shape.

11. A ceramic electronic-part mounting structure, comprising:
    a substrate; and
    a ceramic electronic component mounted on said substrate, the ceramic electronic component having a terminal formed thereon; and further comprising
    a terminal member comprising a metal plate having a length, one end of the metal plate being connected to the terminal,
    wherein the length of said terminal member between said ceramic electronic component and said substrate measured along the length of the terminal member is at least 5 mm.

12. The ceramic electronic-part mounting structure of claim 11, wherein the length of the terminal member between said ceramic electronic component and the substrated measured along the length of the terminal is equal to or less than 10 mm.

13. The ceramic electronic-part mounting structure of claim 11, wherein a thermal conductivity of said terminal member is equal to or less than 0.3 cal/cm/sec/° C.

14. The ceramic electronic-part mounting structure of claim 11, wherein a degree of radiation of said terminal member is at least 0.03, provided that the blackbody radiation-degree is 1.

15. The ceramic: electronic-part mounting structure of claim 12, wherein a thermal conductivity of said terminal member is equal to or less than 0.3 cal/cm/sec/° C.

16. The ceramic electronic-part mounting structure of claim 12, wherein a degree of radiation of said terminal member is at least 0.03, provided that the blackbody radiation-degree is 1.

17. The ceramic electronic-part mounting structure of claim 13, wherein a degree of radiation of said terminal member is at least 0.03, provided that the blackbody radiation-degree is 1.

18. The ceramic electronic-part mounting structure of claim 11, wherein the metal plate has an inverted U-shape.

19. The ceramic electronic-part mounting structure of claim 11, wherein the metal plate has an inverted U-shape.

20. The ceramic electronic-part mounting structure of claim 11, wherein the metal plate has a zig-zag shape.

* * * * *